US005166982A

United States Patent [19]

Shintaku

[11] Patent Number: 5,166,982

[45] Date of Patent: * Nov. 24, 1992

[54] HORN SPEAKER HAVING A COOLING DEVICE

[75] Inventor: Yoshishige Shintaku, Osaka, Japan

[73] Assignee: Ibuki Kogyo Co. Ltd., Osaka, Japan

[ * ] Notice: The portion of the term of this patent subsequent to Jun. 24, 2002 has been disclaimed.

[21] Appl. No.: 312,904

[22] Filed: Oct. 19, 1981

[30] Foreign Application Priority Data

Feb. 18, 1981 [JP] Japan .................................. 56-22526

[51] Int. Cl.[5] .............................................. H03G 11/00

[52] U.S. Cl. ...................................... 381/55; 381/194; 381/117

[58] Field of Search ................ 179/115.5 H; 381/117, 381/55, 87, 90, 150, 192, 194

[56] References Cited

U.S. PATENT DOCUMENTS 4,017,694 4/1977 King .................................. 381/194
4,303,806 12/1981 Thiele .................................. 381/194
4,320,263 3/1982 Thiele .................................. 381/197

FOREIGN PATENT DOCUMENTS 2842999 4/1980 Fed. Rep. of Germany .

*Primary Examiner*—Forester W. Isen
*Attorney, Agent, or Firm*—Marvin H. Kleinberg

[57] ABSTRACT

A horn speaker in which a cooling device is attached near a moving coil which vibrates a diaphragm. The cooling device may be attached to the inner periphery of a bobbin which is connected to the diaphragm and around the outer periphery of which the moving coil is wound.

3 Claims, 1 Drawing Sheet

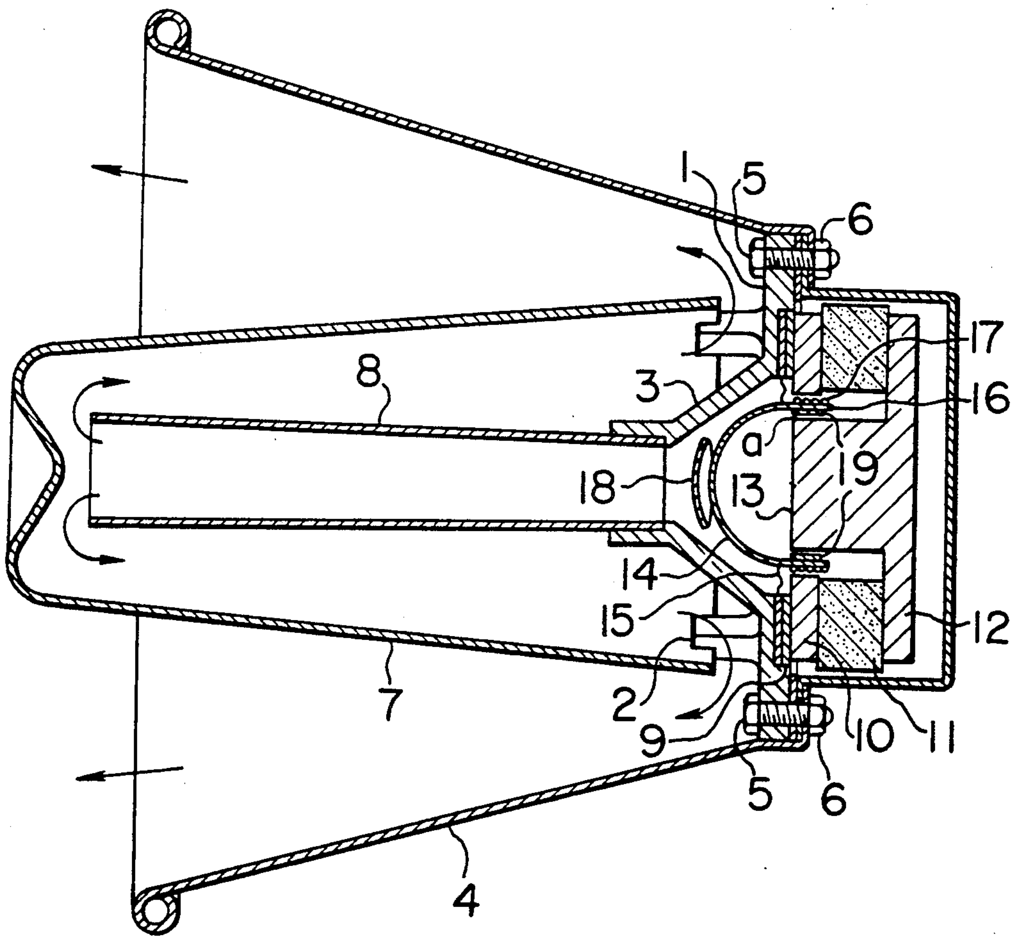
1
5
6
17
3
16
8
a
19
18
13
14
15
12
7
2
9
10
11
5
6
4

HORN SPEAKER HAVING A COOLING DEVICE

BACKGROUND OF THE INVENTION

The present invention relates to a horn speaker and more particularly relates to a horn speaker having a cooling device for cooling a moving voice coil.

A conventional loud speaker, use in a siren for a ship or the like, is required to be a type having a possibly larger voice output. In order to obtain this effect a powerful permanent magnet is used in a horn-type speaker to obtain a good electro-acoustic transducing efficiency, and a larger voice current is adapted to be input.

However, since a moving voice coil is positioned in narrow air gap between the two magnetic poles of the permanent magnet in order to obtain a strong magnetic field, its cooling effect is bad, and further, a much thicker coil cannot be used in order to reduce the mass of the vibrating parts.

Therefore, when an excessive input is applied to the speaker or it is used continuously for a long period of time, the moving voice coil is often broken by overheating.

SUMMARY OF THE INVENTION

It is an object of the present invention to provide a horn speaker having a cooling device free from the aforementioned disadvantages, which is effective, compact and stable.

According to the present invention there is provided a horn speaker in which a cooling device is attached near a moving coil which vibrates a diaphragm.

BRIEF DESCRIPTION OF DRAWING

The present invention will now be described with reference to the accompanying drawing, in which:

Figure is a central longitudinal cross-section of one embodiment of a horn speaker according to the present invention.

DESCRIPTION OF A PREFERRED EMBODIMENT

Referring now to the drawing there is shown in the Figure one embodiment of a horn speaker according to the present invention.

An annular base plate 1 is provided with several brackets 2 for supporting a tubular reflector 7 in its front surface. A funnel-shaped support cylinder 3 for supporting an inner horn 8, whose diameter contracts frontward, is integrally connected to the inner periphery of the base plate 1.

An outer cylindrical horn 4 expanding frontward is mounted to the outer periphery of the base plate 1 in its base part by means of bolts 5 and nuts 6. The tubular reflector 7 expanding rearwards and having a closed front end is supported in its open rear end inside the outer horn 4 by the brackets 2. The rear end of the tubular inner horn 8 expanding frontward slightly is mounted to the front end of the support cylinder 3.

Behind the base plate 1, a retainer ring 9, an annular yoke 10, an annular permanent magnet 11, and a circular yoke 12 are mounted one on another. The circular yoke 12 is provided with a center pole 13 which projects forward in its center so that a narrow annular air gap (a) may be formed between the annular yoke 10 and the front portion of the center pole 13.

In the space between the support cylinder 3 and the front of the center pole 13, a diaphragm 14 having a half-spherical shape extending frontward is arranged and supported by an annular damper 15 which is mounted between the base plate 1 and the retainer ring 9.

A bobbin 16 is integrally connected to the rear end of the diaphragm 14 and is inserted in the gap (a) between the annular yoke 10 and the center pole 13. A moving voice coil 17 for vibrating the diaphragm 14 is wound around the outer surface of the bobbin 16. An equalizer 18 is arranged in front of the diaphragm 14 apart a little therefrom.

A plurality of active electronic cooling elements, such as thermoelectric coolers or thermo-modules 19 are attached to the inner surface of the bobbin 16. When the electric current is supplied to the thermoelectric coolers or thermo-modules 19 during the generating of the sound, the moving coil 17 is cooled via the bobbin 16. Therefore, a voice current larger than that of a conventional speaker can be applied to the moving coil 17 and thus the speaker described above can be used for a powerful output.

Although the present invention has been described with reference to a preferred embodiment thereof, various changes and modifications can be made by those skilled in the art without departing from the scope of the present invention.

What is claimed is:

1. A horn speaker comprising:

(a) a diaphragm for producing sonic vibrations;

(b) a moving coil for driving said diaphragm; and (c) an active thermoelectric cooling device attached near said moving coil to remove heat from said coil.

2. A horn speaker having:

(a) a diaphragm;

(b) a moving coil for driving said diaphragm, said moving coil being wound around the outer periphery of a bobbin which is connected to said diaphragm; and (c) an active thermoelectric cooling device attached near said moving coil, said cooling device being attached to the inner periphery of said bobbin.

3. A horn speaker as defined in claim 2, wherein the bobbin is integrally connected to the periphery of the diaphragm.

* * * * *